(12) United States Patent
Rubin et al.

(10) Patent No.: US 7,432,438 B2
(45) Date of Patent: Oct. 7, 2008

(54) ELECTRODE FOR PHOTOVOLTAIC CELLS, PHOTOVOLTAIC CELL AND PHOTOVOLTAIC MODULE

(75) Inventors: Leonid B. Rubin, Vancouver (CA); George L. Rubin, Vancouver (CA)

(73) Assignee: Day 4 Energy Inc., Burnaby, British Columbia (CA)

( * ) Notice: Subject to any disclaimer, the term of this patent is extended or adjusted under 35 U.S.C. 154(b) by 73 days.

(21) Appl. No.: 10/525,923

(22) PCT Filed: Aug. 21, 2003

(86) PCT No.: PCT/CA03/01278

§ 371 (c)(1), (2), (4) Date: Feb. 25, 2005

(87) PCT Pub. No.: WO2004/021455

PCT Pub. Date: Mar. 11, 2004

(65) Prior Publication Data

US 2005/0241692 A1    Nov. 3, 2005

(30) Foreign Application Priority Data

Aug. 29, 2002 (DE) .............................. 102 39 845

(51) Int. Cl.
*H01L 31/00* (2006.01)
(52) U.S. Cl. .................. 136/256; 136/244; 136/259
(58) Field of Classification Search ......... 136/243–265; 438/57–98
See application file for complete search history.

(56) References Cited

U.S. PATENT DOCUMENTS 3,982,964 A   9/1976   Lindmayer et al.

3,996,067 A   12/1976   Broder (Continued)

FOREIGN PATENT DOCUMENTS

EP    0 807 980 A2   *   11/1997

(Continued)

OTHER PUBLICATIONS

Raabe et al., High Aspect Ratio Screen Printed Fingers, Proc. of the 20th European Photovoltaic Solar Energy Conference, Jun. 6-10, 2005, Barcelona, Spain.

(Continued)

*Primary Examiner*—Alex S. Noguerola
*Assistant Examiner*—Jeffrey T. Barton
(74) *Attorney, Agent, or Firm*—Richard T. Black; P. G. Scott Born; Black Lowe & Graham PLLC

(57) ABSTRACT

An electrode for contacting an electrically conductive surface of a photovoltaic element includes an electrically insulating optically transparent film, an adhesive layer provided on a planar surface of the film, and a plurality of substantially parallel, electrically conductive wires embedded into the adhesive layer. The plurality of wires lies over the planar surface of the film. A part of the surfaces of the wires protrude from the adhesive layer. At least the part of the surfaces protruding from the adhesive layer are covered by a coating consisting of an alloy having a low melting point to solder the wires to the electrically conductive surface and to a first terminal bar. The adhesive layer has a thickness less that a thickness of the wires embedded therein.

17 Claims, 13 Drawing Sheets

U.S. PATENT DOCUMENTS

| | | |
|---|---|---|
| 4,027,652 A | 6/1977 | Collura |
| 4,291,191 A | 9/1981 | Dahlberg |
| 4,315,096 A | 2/1982 | Tyan et al. |
| 4,320,154 A | 3/1982 | Biter |
| 4,380,112 A * | 4/1983 | Little .......................... 438/64 |
| 4,499,658 A | 2/1985 | Lewis |
| 4,517,403 A | 5/1985 | Morel et al. |
| 4,603,470 A | 8/1986 | Yamakazi |
| 4,697,041 A | 9/1987 | Okaniwa et al. |
| 5,084,107 A | 1/1992 | Deguchi et al. |
| 5,158,618 A | 10/1992 | Rubin et al. |
| 5,223,044 A | 6/1993 | Asai |
| 5,330,583 A | 7/1994 | Asai et al. |
| 5,391,236 A | 2/1995 | Krut et al. |
| 5,457,057 A | 10/1995 | Nath et al. |
| 5,474,620 A * | 12/1995 | Nath et al. .................. 136/251 |
| 5,681,402 A * | 10/1997 | Ichinose et al. ............. 136/256 |
| 5,759,291 A | 6/1998 | Ichinose et al. |
| 5,942,048 A | 8/1999 | Fujisaki et al. |
| 6,121,542 A | 9/2000 | Shiotsuka et al. |
| 6,184,458 B1 | 2/2001 | Murakami et al. |
| 6,384,313 B2 | 5/2002 | Nakagawa et al. |
| 6,784,358 B2 | 8/2004 | Kukulka |
| 6,803,513 B2 | 10/2004 | Beernink et al. |
| 2002/0062828 A1 | 5/2002 | Nydahl et al. |
| 2005/0241692 A1 | 11/2005 | Rubin et al. |

FOREIGN PATENT DOCUMENTS

| | | |
|---|---|---|
| JP | 59115576 A2 | 12/1982 |
| JP | 01206671 A2 | 2/1988 |
| JP | 7321351 | 12/1995 |

OTHER PUBLICATIONS

Hoornstra et al., The Importance of Paste Rheology in Improving Fine Line, Thick Film Screen Printing of Front Side of Metallization, Proc. of the 14th European Photovoltaic Solar Energy Conference, Jun. 30-Jul. 4, 1997, Barcelona Spain.

Burgers et al., Interruption Tolerance of Metallization Patterns, Proc of the 12th European Photovoltaic Solar Energy Conference, Apr. 11-15, 1994; Amsterdam, The Netherlands.

Patent Abstracts of Japan; vol. 1996, No. 04, Apr. 30, 1996.

* cited by examiner

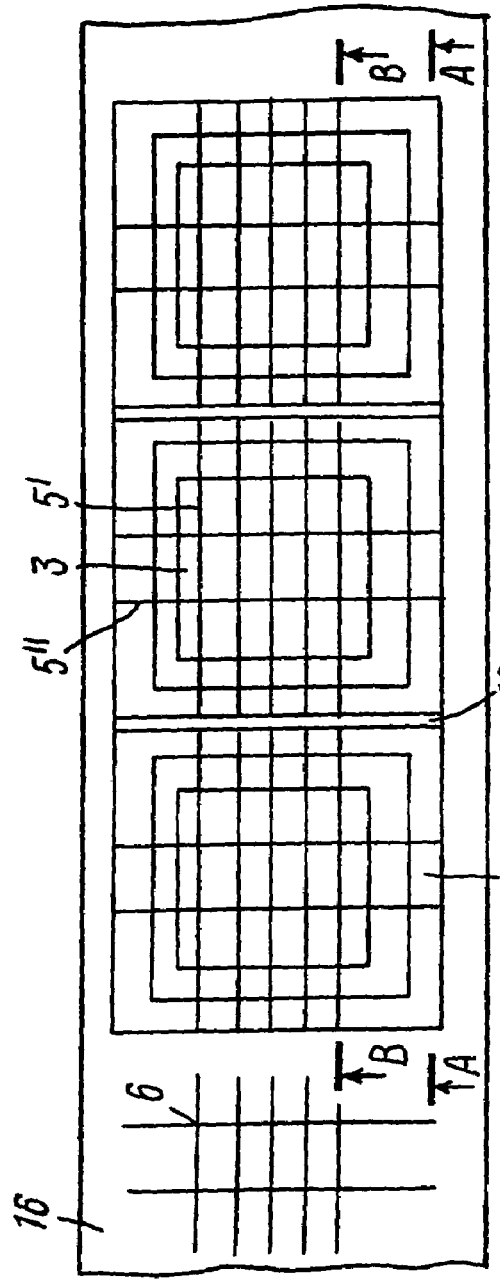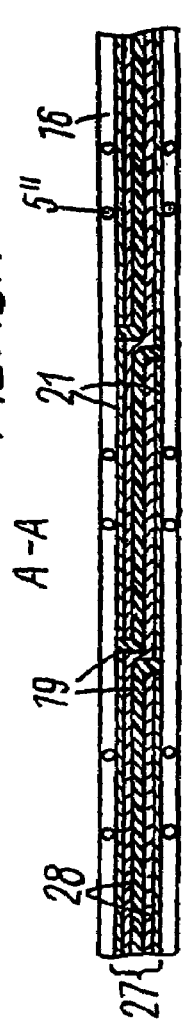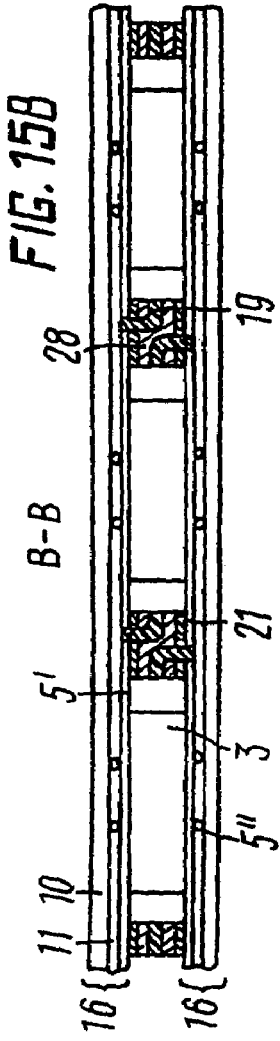

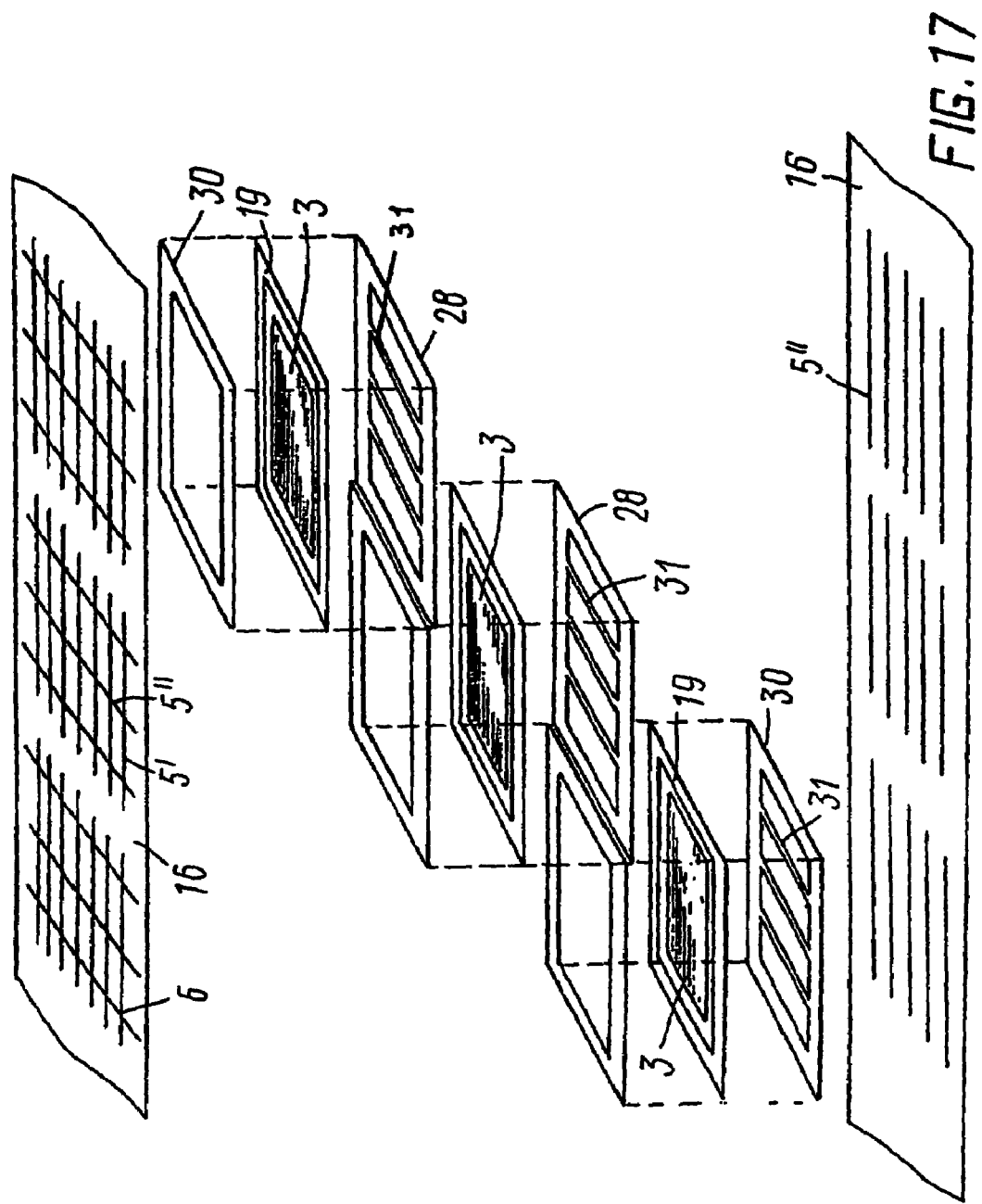

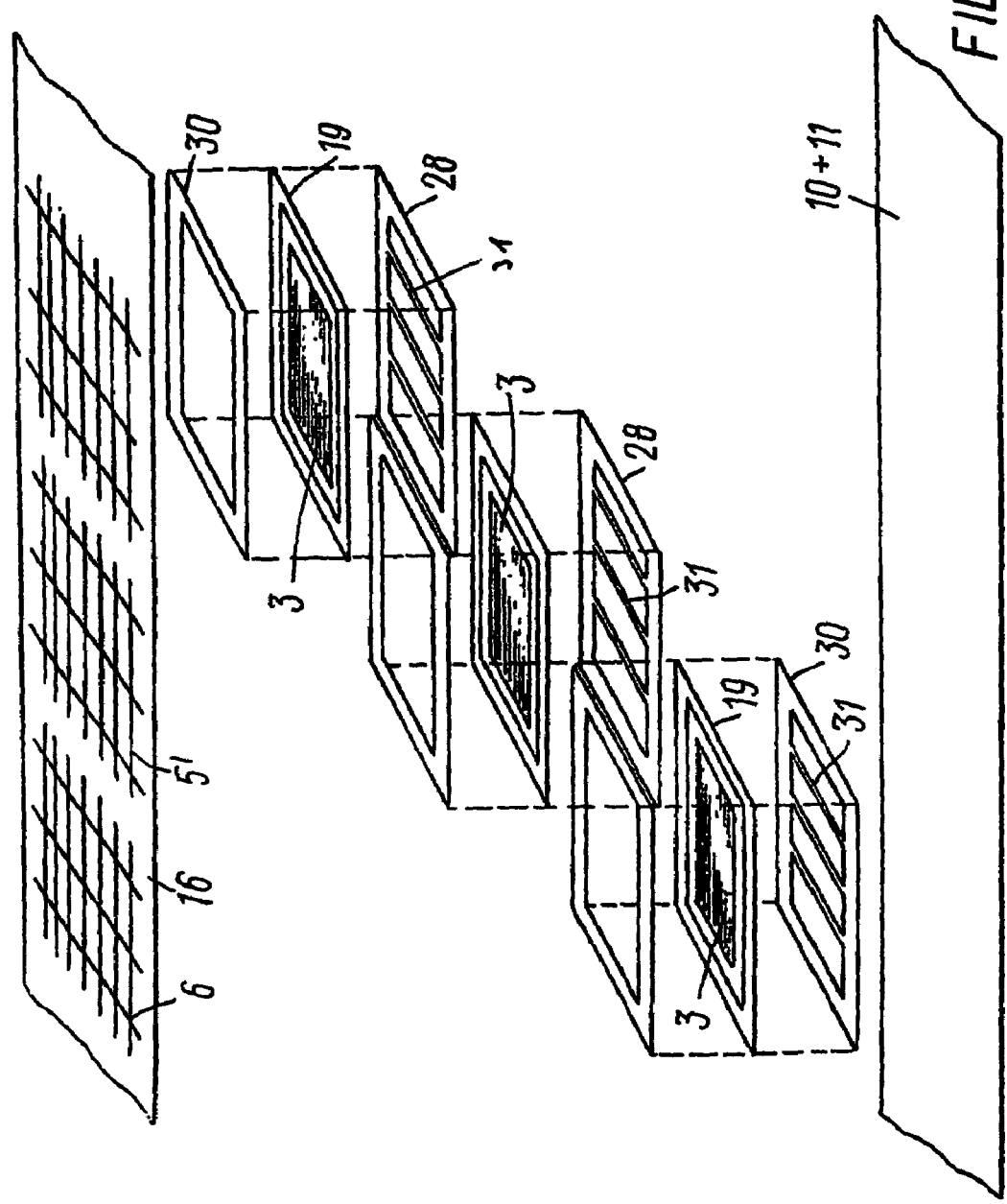

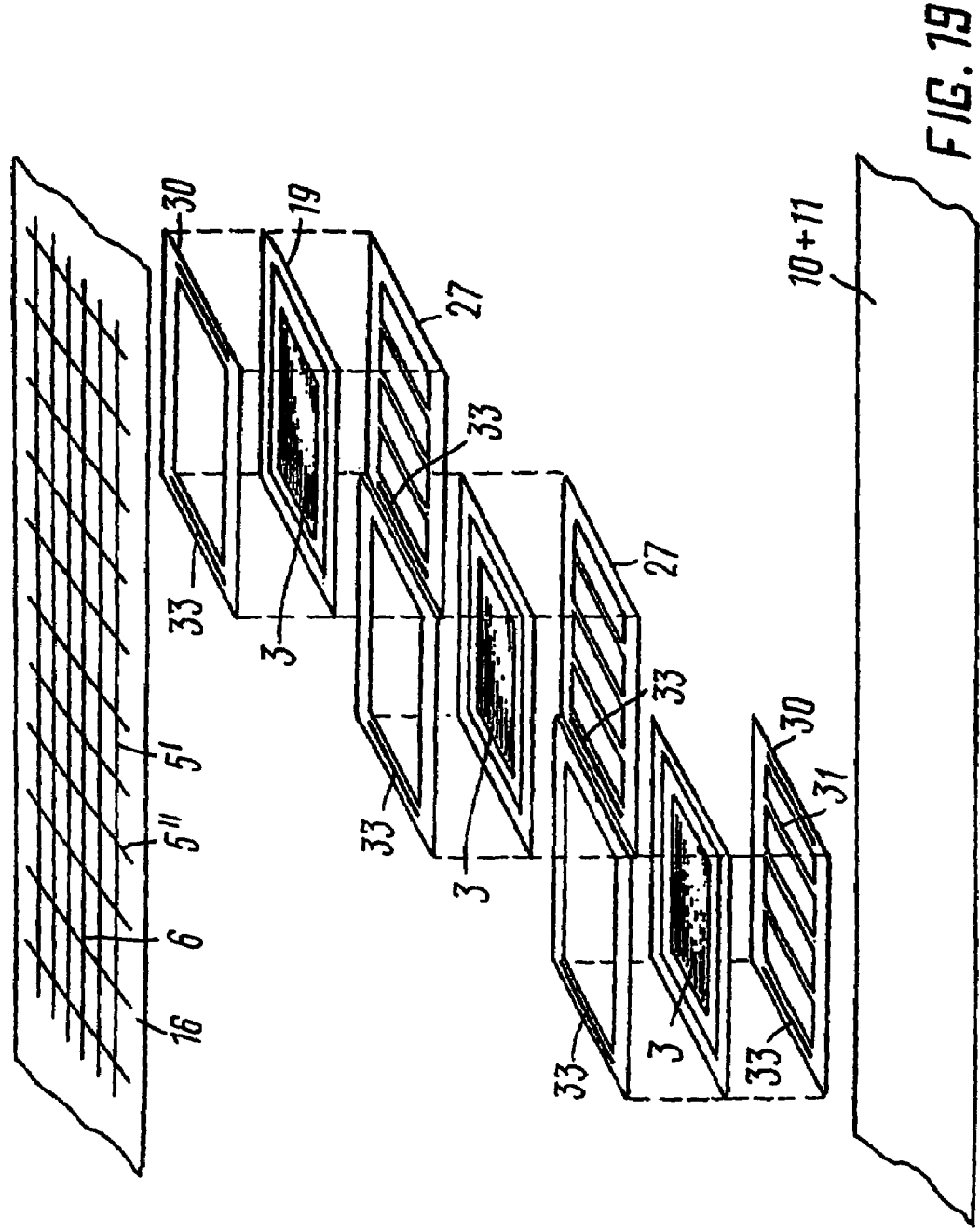

ELECTRODE FOR PHOTOVOLTAIC CELLS, PHOTOVOLTAIC CELL AND PHOTOVOLTAIC MODULE

CROSS-REFERENCES TO RELATED APPLICATIONS

This document is submitted, pursuant to 35 U.S.C. § 371, as the National Stage of International Application (WO 2004/021455A1) filed 21 Aug. 2003, which in turn has already properly claimed priority to German Application (102 39 845.3) filed 29 Aug. 2002.

BACKGROUND OF THE INVENTION

The invention relates to an electrode for contacting electrically conductive surfaces, in particular for contacting one or a plurality of photovoltaic (PV) elements being part of a photovoltaic cell or solar cell. The invention further relates to photovoltaic cells produced with this electrode.

The generation of electrical energy using photovoltaic technology has reached a high standard. However, the production of PV cells and PV modules is still rather complicated and expensive. Also the efficiency of energy generation using PV modules with a maximum efficiency of about 17 percent is rather low. From an economic point of view the generation of electric power using photovoltaic technology is only acceptable under current conditions if it is supported and/or subsidized by some means, e.g. by the so called 100 000-roofs program in Germany or similar programs in California, USA. Thus, in the field of photovoltaic technology there still remains a critical requirement to lower the production costs and enhance the efficiency of the energy generation using PV elements and PV modules.

Commonly used PV cells comprise a semiconductor element with a junction of the type ($n^+n$ (or p) $p^+$) on the basis of mono- or multicrystalline silicon, amorphous silicon and other thin-film semiconductors with an embedded p-n junction. One surface of the element is usually covered with a metal layer, such as aluminum or stainless steel, while the other surface is provided with an anti-reflective coating. Both surfaces are in contact with electrodes, which collect and carry off the generated electrical energy. This structure is embedded between transparent protective layers, such as glass.

The electrodes are all produced using screen-printing technology. However, electrodes produced this way have a high series resistance. Apart from this, expensive devices and equipment are required for the production and cost reduction is limited when this technology is employed.

From the patent U.S. Pat. No. 5,759,291 A (Inchinose et. al.) a semiconductor element (wafer) with parallel metallic contact or current collecting wires (electrodes) which are fixed to the surface of the element by means of a conductive adhesive, in which conductive particles are dispersed is known. These electrode wires are arranged in parallel between connecting conductors which are running along the edges of the element. For this type of electrode the ohmic contact resistance between the semiconductor surface and the wires is relatively high, which results in a high energy loss and a low efficiency especially under concentrated solar radiation. Also, the production of such PV cells is rather complicated.

From the patent U.S. Pat. No. 5,084,107 A (Deguchi et. al.) a similar solar cell and array of solar cells are known, wherein metallic electrode wires are adhered to the surface of the photovoltaic element by means of an adhesive material. In the adhesive, conductive particles are dispersed. Also with this electrode structure, the production costs and the contact resistance between the wires and the surface of the element are fairly high.

From the patent U.S. Pat. No. 5,158,618 A (Rubin et al.) an electrode structure is known, wherein the contact wires are embedded in a transparent polymer block in such a way, that they partly protrude from the polymer block. Said electrodes contact the element from one or from two sides and are sandwiched between transparent protective layers, such as glass. As the wires of the electrode are, for example, configured as coils, there are only point contacts between the wires and the surface of the PV element. Thus, also in this case the series resistance of a PV cell is relatively high. Also the production costs are relatively high, since the automated production of such types of solar cells and PV modules is not possible.

BRIEF SUMMARY OF INVENTION

An objective of the invention is therefore to provide for an electrode which at low production costs achieves a lower contact resistance between the electrodes and a conductive surface, in particular the surface or surfaces of a photovoltaic element.

A further objective of the invention is to provide for a PV cell which allows, by using such an electrode, lowering the combined series resistance and the production costs of PV cells and PV modules and enhancement of their efficiency.

The invention achieves these objectives by providing an electrode for contacting an electrically conductive surface, in particular for contacting at least one surface of a photovoltaic element, the electrode comprising an electrically insulating optically transparent film, an adhesive layer provided on one surface of said film, and a first plurality of substantially parallel, electrically conductive wires being embedded into the adhesive layer, a part of the surfaces of said wires protruding from the adhesive layer and at least on the surface protruding from the adhesive layer being covered by a coating consisting of an alloy with a low melting point, wherein the wires of the first plurality are electrically connected to a first terminal bar.

Preferably, a second plurality of wires substantially running parallel to each other is disposed between the transparent film and the wires of said first plurality, the wires of the first and second pluralities forming together a mesh, and the wires of the second plurality being electrically connected to a second terminal bar.

In a further preferred embodiment the first and second terminal bars are electrically connected to each other.

The terminal bar(s) may be provided at the respective ends of the wires.

In that embodiment the terminal bar(s) are preferably provided at opposite ends of the wires of the first or of the first and second pluralities of wires outside the contour of the photovoltaic element, to the surface of which the wires are to be connected.

The first and second terminal bars are preferably connected to form an angle.

In a further preferred embodiment the terminal bars are formed as a U-formed frame, the wires of one of the two pluralities being connected to the base and the wires of the other plurality being connected to the free legs of the U.

In the embodiment when the terminal bar(s) are provided at opposite ends of the wires of the first or of the first and second pluralities the terminal bars are preferably extending over the length of two adjacent photovoltaic elements to be connected and that a step is provided in their centre, so that a plurality of terminal bars can be fit together forming one row, in which the one half of a terminal bar is arranged below or above the lower or upper halves, respectively, of the neighbouring terminal bar, wherein between the terminal bars an insulating film is provided.

Further, the terminal bars may be formed as a closed frame, the open area (window) of said frame exceeding the dimensions of the corresponding photovoltaic element.

It is a further preferred embodiment to have the terminal bar(s) formed as a double frame with two adjacent windows, the open area of which exceeds the dimensions of the corresponding photovoltaic elements.

The frame may comprise two metallic frames with an insulating film provided between them.

In a further preferred embodiment a step is provided in the central bar of the double frame, so that a plurality of frames can be fit together forming one row, in which the one half of a double flame is arranged below or above the lower or upper halves, respectively, of the neighbouring double frame.

A slot can be provided in the central bar of the double frame, and said slot running parallel to said step, so that upon completion of a PV module the traversing wires of the electrode can be cut.

Finally, metallic bars may be arranged spanning over at least one window of the frame(s), said bars being integrally connected with the corresponding metallic frame.

The invention further achieves the above objectives by providing a plurality of electrodes according to any of the embodiments described above wherein the electrodes are formed as an endless, continuous strip, which can be cut to a length corresponding to the length of an array of adjacent photovoltaic elements to be connected for forming a PV module, wherein the wires running in longitudinal direction of the strip are cut at distances corresponding to the distances of the PV cells.

Preferably, an endless terminal bar may be provided along at least one of the edges of the transparent film wherin, again preferably, along each edge of the transparent film there are arranged comb-like terminal bars, the teeth of which reaching respectively from one side between two adjacent photovoltaic elements over the width of the wires of the first plurality and alternately being in electrical contact with the upper and lower sides of corresponding photovoltaic elements and being isolated from the other surface.

The invention farther achieves the above objectives by providing a PV cell or a PV module comprising at least one electrode or one electrode strip according to any of the preceding embodiments, comprising one or more photovoltaic cells with an electrically conductive, antireflective, optically transparent coating on at least one of its surfaces, the wires of the first plurality being soldered onto the coating and onto the respective terminal bars or terminal frames by means of the alloy.

When the wires of the first and second pluralities are arranged to form a mesh the wires of the first and second pluralities are preferably bonded together at their crossing points and onto the respective terminal bars or terminal frames by means of the alloy.

The electrode according to the invention provides for an intimate and reliable ohmic contact with the surface to be contacted and provides achievement of 8 to 10 times lower combined series resistance of a PV cell or PV module which not only improves the PV elements' efficiency but allows them to operate under 8 to 10 times concentrated solar radiation. This refers particularly to those embodiments, wherein the wires of the first and second pluralities are arranged with respect to each other in the form of a mesh and are connected to angularly or rectangularly formed connecting conductors.

Simultaneously, during production the degree of automation and the throughput capacity may be substantially increased.

BRIEF DESCRIPTION OF THE SEVERAL VIEWS OF THE DRAWINGS

In the following, the invention is explained in more detail by the embodiments illustrated in the drawings.

FIG. 15A is the view of an array of PV cells being arranged in series in the form of a strip, FIG. 15B shows the section A-A of FIG. 15A, FIG. 15C shows the section B-B of FIG. 15A, FIG. 17 is a schematic exploded view of the elements of a PV module with series-connected PV cells, FIG. 18 shows a further embodiment of a PV module similar to that of FIG. 17, and FIG. 19 shows a further embodiment of a PV module similar to that of FIGS. 17 and 18.

DETAILED DESCRIPTION OF THE INVENTION

Figure 1:
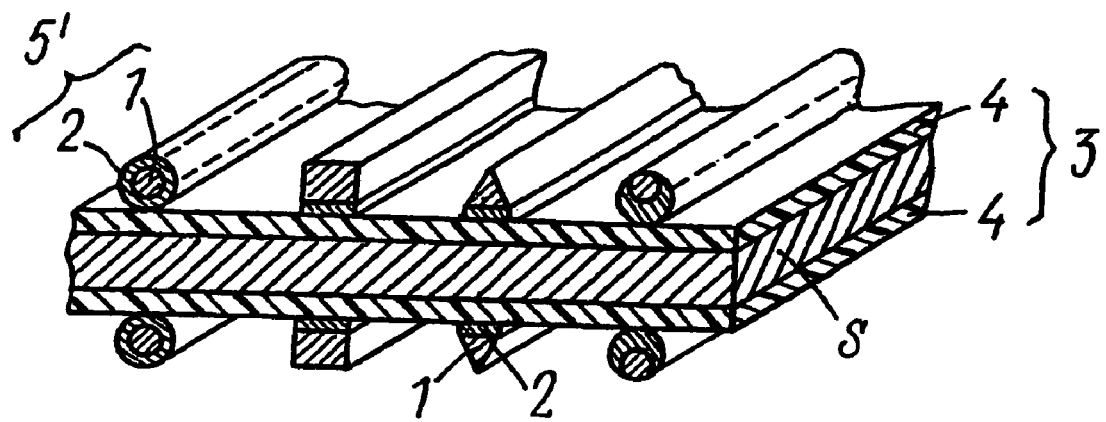
FIG. 1 is a schematic isometric partial view of a PV cell before.

FIG. 1 shows a semiconductor structure S, for example Silicon ($n^+n$ (or p) $p^+$), the upper surface of which (always in relation to the depiction in the figure) is covered with an anti-reflective, transparent, electrically conductive coating 4 such as, for example, Indium-Tin-Oxide (ITO). The element S can also consist of a thin-film PV element. The lower surface of the element S is coated either with a metal coating (e.g. aluminium) or alternatively with an anti-reflective, transparent, electrically conductive coating 4. The element S and the upper coating 4 form together with the metal coating (not depicted) or the second, lower ITO-coating 4 a unit, hereinafter referred to as a wafer 3. The two surfaces of the wafer 3 are in contact with the metallic wires 1, which are coated with a coating 2 consisting of an alloy having a low melting point. The wires 1 may be completely coated with the alloy coating 2 or only partly coated on the side or sides facing the surface to be contacted In the following, the coated wires are referred to as a first plurality of wires 5'. They are in direct contact with the surface or surfaces of the wafer 3.

Figure 2:
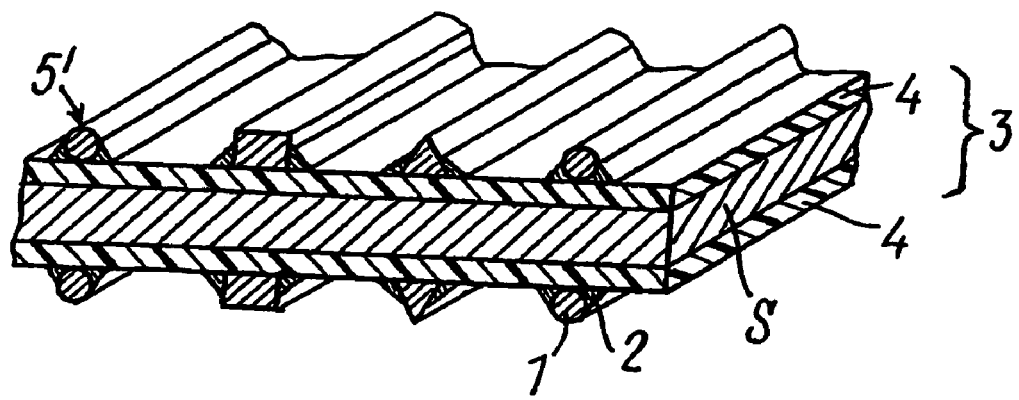
FIG. 2 after a heating and/or pressing step during the production of a PV cell.

FIG. 2 shows the arrangement of FIG. 1 after pressing and heating up to 120°. The material of the alloy coating 2 has slightly softened and wetted the coating 4, and is in ohmic contact with said coating and the wires 5'. The same refers to the case in which the lower side of the element S is not to be provided with an anti-reflective, transparent, conductive coating 4, but with a metal coating. The distance of the wires 5' is not required to be uniform, i.e. the parallel wires 5' may be arranged in pluralities of two or more wires 5' with different distances between the wires and the wires of a plurality.

The cross-sectional form and size of the wires are chosen to optimize the electric current collection by the wires, the current density in the wires, the series resistance of the PV cell and the size of the wafer area shadowed by the wires 5'. As shown in FIGS. 1 and 2, different cross-sectional forms may be chosen for the wires 5', for example circular, rectangular, triangular etc. Of course, for the wires 5' of a particular PV cell or PV module respectively only one cross-sectional form is chosen.

Figure 3:
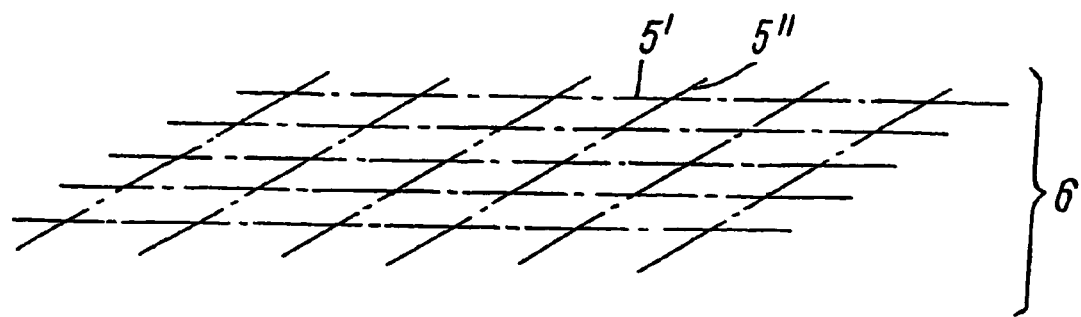
FIG. 3 is a schematic isometric view of a mesh of contact wires.

FIG. 3 shows a wire mesh 6 of wires 5' of the first and wires 5" of a second plurality, wherein the wires 5', 5" of the first and second pluralities are usually running perpendicularly to each other. The wires 5" are, at least on the surfaces facing the wires 5', also covered with an alloy coating 2. However, if the amount of alloy material on the wires 5' of the first plurality is sufficient for a safe mechanical and electrical connection of the two pluralities of wires at the crossing points, the alloy coating on the wires 5" of the second plurality could be omitted. As to the choice of the distances of the wires 5" and of the cross-sectional form and area, the same considerations as for the arrangement and size of the wires 5' are to be applied. Of course, for the wires 5" a cross-sectional form and size different from that of the wires 5' can be chosen.

Figure 4:
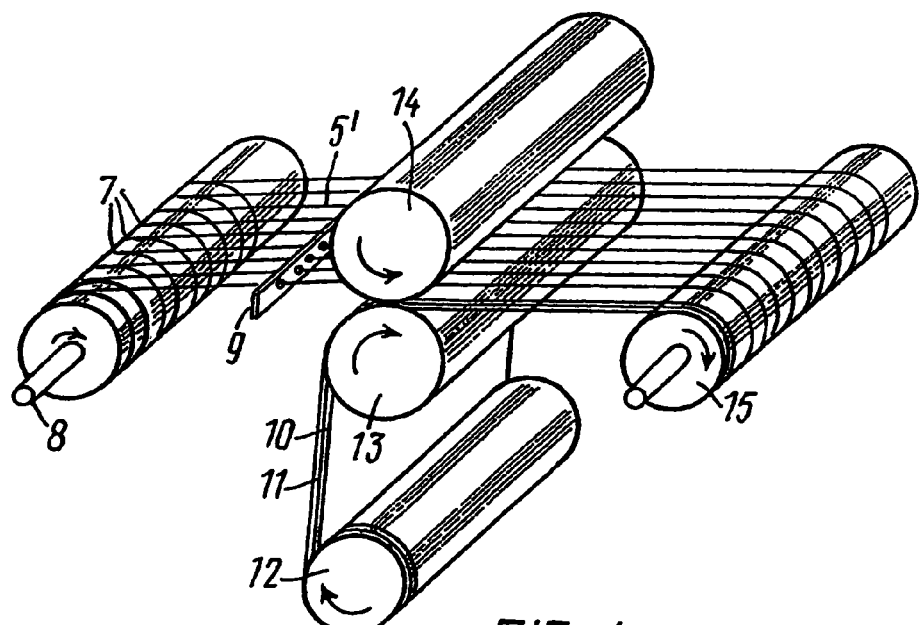
FIG. 4 is a schematic isometric view of a device for producing film-type adhesive optically transparent electrodes.

FIG. 4 shows the schematic view of a device for producing a film-type adhesive optically transparent electrode. Initially, the alloy-coated wires 5' are wound up on several rolls 7, the number of which equals the width of the PV cell divided by the required distances between the parallel running wires 5' of the first plurality. For example, at a width of the PV cell of 100 mm and a distance between the wires of 4 mm, 26 rolls 7 are required. The rolls 7 are fastened on an axis 8, so that it is possible to form parallel lines of wires 5', which are running through corresponding openings in a frame 9. The distance between the openings in the frame 9 is determined by the requested distance between the parallel wires 5'. Size and form of the openings in the film 9 have to correspond to the size and form of the cross-sectional area of the wires 5'.

Figure 5A:
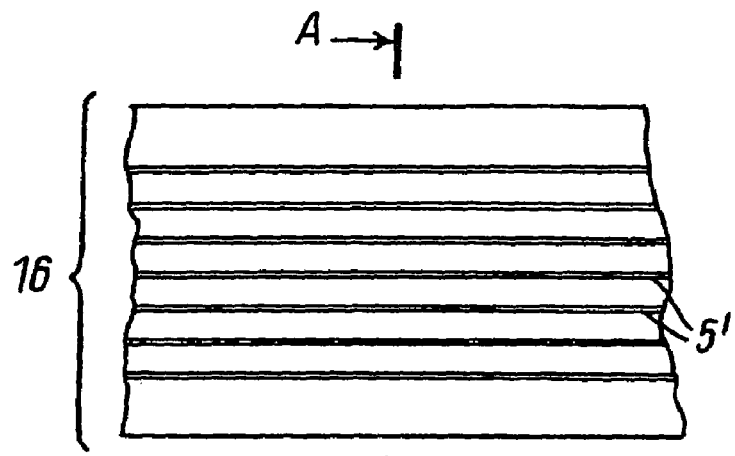
FIG. 5A is a view of an electrode produced with the device of FIG. 4.

The parallel wires 5' are disposed on a polymeric film 10, which is supplied from a drum 12. The surface of the film 10 facing the wires 5' is coated with a transparent adhesive 11. The overall width of the film 10, on which the wires 5' are placed, exceeds the width of one or an array of several wafers 3, so that on each side of the film 10 a zone of 1.5 to 2 cm remains free of wires 5' (FIG. 5A). The film 10 is lead by the drum 12 over the surface of a rotatable roller 13 and is pulled by a drum 15, simultaneously pulling the wires 5'. The wires 5' are pressed on the film 10 by means of another roller 14 arranged above the rotatable roller 13. Simultaneously, the film 10 is heated by the rollers 13 and 14, so that the adhesive 11 softens, the wires 5' immerse in the adhesive 11 and, after cooling down, remain fixed to the film 10 and embedded in the adhesive 11. It is recommended that the opposite side of the polymeric film should be primed by adhesive material to allow further PV cell encapsulation between protective layers.

Figure 5B:
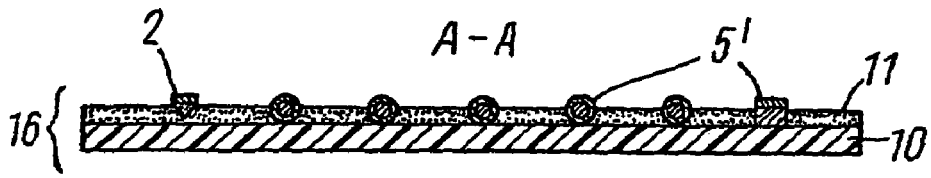
FIG. 5B shows the cross-section A-A of FIG. 5A.

FIGS. 5A and 5B show in detail the result of this process, namely a transparent electrode 16. The wires 5' extending along the polymeric film 10 are embedded in the adhesive 11 and pressed onto the film 10. A part of the surface of the wires 5' is protruding from the surface of the adhesive 11. In FIG. 5B, on the left and right-hand other possible cross-sectional forms of the wires 5' are again depicted.

Figure 5C:
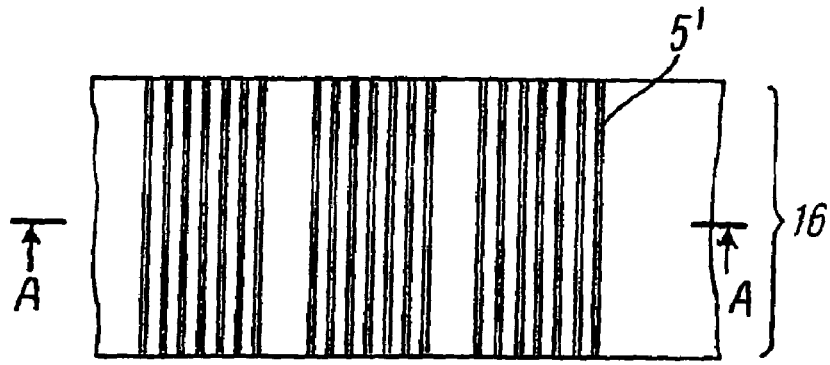
FIG. 5C is a view of an electrode strip with wires running transversely to the direction of the wires of FIG. 5A.
Figure 5D:
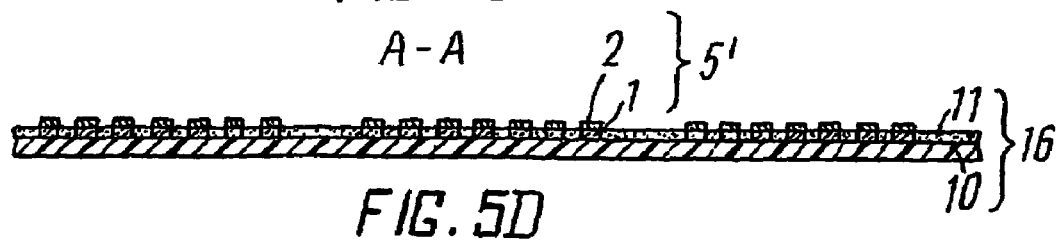
FIG. 5D shows the cross-section A-A of FIG. 5C.

A production device similar to that of FIG. 4 may be used for producing a polymeric film 10 with embedded wires 5' being transversely arranged to the initial direction of the film 10 (FIGS. 5C, 5D). The width of the polymeric film 10 has hereby to correspond to the required length of a PV cell or PV module. After the wires 5' of the first plurality are embedded in the film 10, it may be cut in pieces transverse to the initial extension of the film 10.

The distance of the wires 5' and/or 5" is not required to be uniform, i.e. the parallel wires 5' and/or 5" can be arranged in groups of two or more wires with different distances between the wires in each group and number of such groups.

Figure 6A:
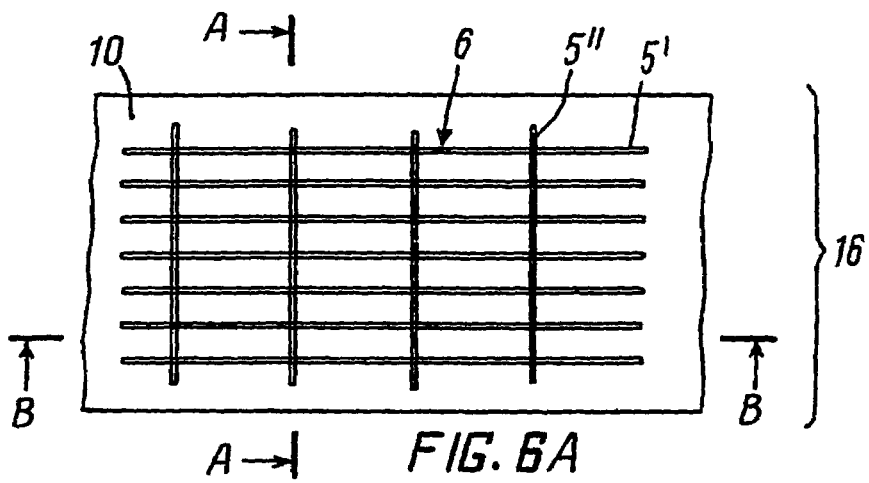
FIG. 6A shows the view of an electrode strip with a wire mesh.
Figure 6B:
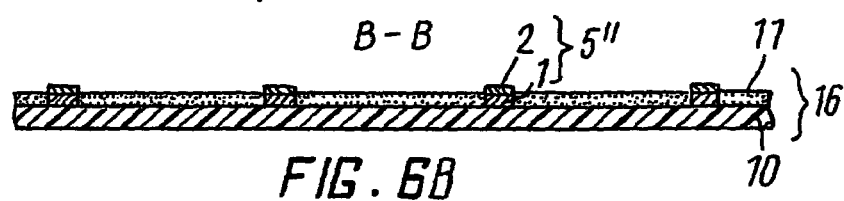
FIG. 6B shows the cross-section B-B of FIG. 6A.
Figure 6C:
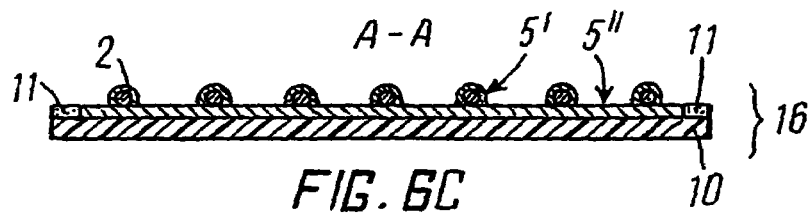
FIG. 6C shows the cross-section A-A of FIG. 6A.

FIG. 6A shows an electrode 16 comprising the transparent polymeric film 10 and a wire mesh 6 of the wires 5' and 5" of the first and second pluralities. Only the wires 5" being more closely located to the polymeric film 10 are immersed in the adhesive 11 (see also FIGS. 6B and 6C). The upper or outer wires 5' operable to contact the surface or surfaces of the wafer 3 are not, at least not completely, immersed in the adhesive 11 (during the production of this type of an electrode 16 the roll 7 carries a wire mesh 6, and frame 9 is not used (FIG. 4)). Already at this point, the wires 5', 5" may be soldered together. However, usually this is done at the time of assembly of the electrode 16 and the wafer 3.

For the polymeric film 10 a wide range of materials may be used: the material must have a high ductility, good insulating characteristics, optical transparency and thermal stability, resistance to shrinkage and have a good adhesive ability. Examples of such materials are cellophane®, rayon, acetate, fluororesin, polysulfone, epoxy resin, and polyamide resin. A suitable material to be used is also the transparent polymeric film Mylar®. Materials to be preferably used are those based on a fluoropolymer, for example the polyvinyl fluoride film Tedlar® and the modified ETFE fluoropolymer resin Tefzel®. These materials are used not only in photovoltaic industry but also for general purposes and for electrotechnical products for lamination purposes.

A wide range of materials having a softening temperature ranging from about 90-110° C. and having a good adhesion to preliminarily primed polymeric films and the surface of the wafer 3 are suitable as adhesive 11. Preferred materials are acrylic adhesive materials rubber adhesive is, silicon adhesive materials and polyvinyl ether adhesive materials as well as epoxy adhesive materials. Materials to be most preferably used are Ethylene Vinyl Acetate, for example, supplied by HI-SHEET INDUSTRIES, LTD and those supplied by Dupont: 68080 Polymethyl methacrylate, 68040 Methacrylate copolymer, 68070 Methacrylate copolymer.

The adhesive layer 11 has to be sufficiently thick in order to provide for a reliable connection of the electrode with the wafer 3. The thickness of the adhesive layer should, however, not exceed the thickness of the wires 5', so that the part of the wires 5' protruding from the adhesive 11, which part is coated with the alloy 2 and is not immersed in the adhesive 11 can later on form a direct ohmic contact with the electrically conductive surface of the wafer 3 (FIGS. 5A, 5D, 6B, 6C).

The polymeric film 10 has to be sufficiently thick, so that it is sufficiently stable when the adhesive 11 is applied and when it is pulled under pressure and heat when attaching the wires 5', 5". Simultaneously, it should be as thin as possible in order to achieve high elasticity and transparency for the light passing through it. Preferably, the thickness of the polymeric film 11 ranges between 10 and 50 μm. As was mentioned before it is preferable if the opposite side of polymeric film is primed with adhesive material.

In FIGS. 5 and 6 the polymeric film 10 is shown with the adhesive 11 and the wires 5' (or the mesh 6 with the wires 5', 5") with the alloy coating 2 protruding from the surface of the adhesive 11, forming a continuous or endless film-type optically transparent adhesive electrode 16.

The electrode 16 of this invention may be applied for the production of PV cells and PV modules Hereby, different types of metallic rods or bars and connections are E d in order to collect the current from the electrode 16 and transmit it further. It is hereby advisable to attach the metallic rods or bars to the electrode 16 by some drops of glue or by brief local beating, thus bonding or fixing the metallic rods or bars to the adhesive 11 of the electrode 16. The distance between the metallic bars and different types of connections has to be designed in such a way that there is enough space between the wafers 3 so that they will not come into direct electrical contact with the constructional elements when they thermally expand under up to 160° C. heating during the assembly of the wafer 3 and the electrode 16.

Figure 7:
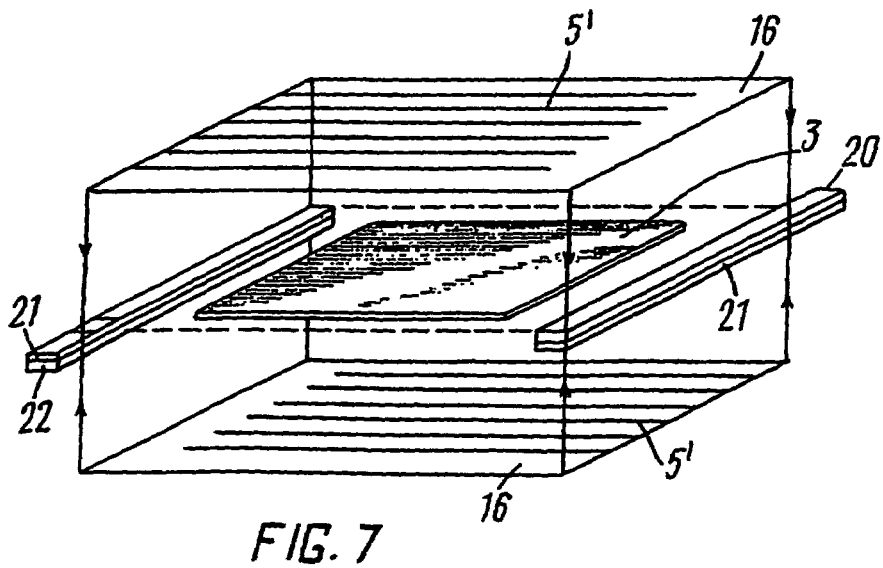
FIG. 7 shows in a schematic isometric exploded view the essential elements of a PV cell before heating and pressing.

FIG. 7 shows a drawn out depiction of a PV cell before its assembling by means of pressing and heating. Electrodes 16 are res vely disposed above and below the wafer 3. In a direction transverse to the longitudinal extension of the wires 5' of the electrodes 16, there are disposed at two opposite sides of the wafer 3 a first terminal bar 20 and a second terminal bar 22, which on their lower or upper sides, respectively, are provided with a coating 21 consisting of an electrically conductive alloy with a low melting point. The wires 5' of the upper electrode 16 are extending from the right border of the wafer 3 up to the left edge of the second terminal bar 22. In reverse, the wires 5' of the lower electrode 16 are extending from the left edge of the wafer 3 to the right edge of the first terminal bar 20. After heating and pressing, the wires 5' of the upper electrode 16 are in ohmic contact with the left, second terminal bar 22 and the upper surface of the wafer 3, while the wires 5' of the lower electrode 16 are in ohmic contact with the lower side of the terminal bar 20 and the lower side of the wafer 3.

The electrically conductive alloys 2, 21 with a low melting point may be represented either by common solders or specially developed ones on the basis of different metals, like Ag, Bi, Cd, Ga, In, Pb, Sn, Ti, etc. It is also possible to use electroconductive material composed of organic adhesives with metallic or alloy particles.

Figure 8:
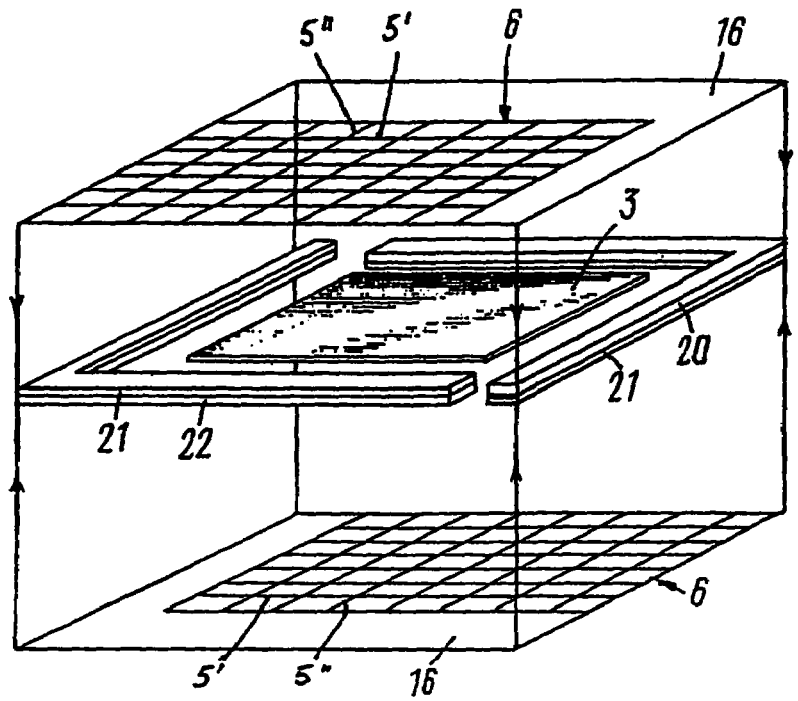
FIG. 8 is a schematic isometric exploded view of a second embodiment of the elements of a PV cell before heating and pressing.

FIG. 8 shows a similar structure, however with angularly formed terminal bars 20, 22 and electrodes 16 with wires 5', 5" arranged in the form of a mesh 6. After pressing and heating, the mesh 6 of the lower electrode 16 is in ohmic contact with the right, first angularly formed terminal bar 20 and the lower side of the wafer 3, while the mesh 6 of the upper electrode 16 is in ohmic contact with the second angularly formed terminal bar 22 and the upper side of the wafer 3.

Figure 9A:
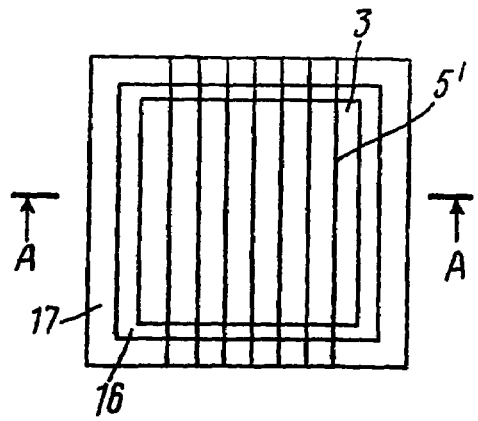
FIG. 9A is a view of a third embodiment of a PV cell.
Figure 9B:
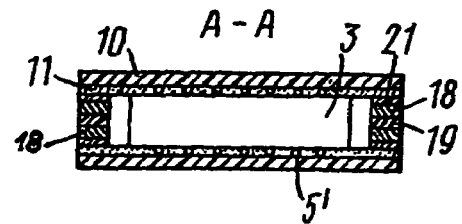
FIG. 9B shows the cross-section A-A of the photovoltaic element of FIG. 9A.

FIGS. 9A and 9B show a PV cell, wherein the terminal bars are configured in the form of a three-layered laminated frame 17, in the window of which the corresponding wafer 3 is accommodated. The wires 5' are running between two opposite sides of the frame 17, onto which sides they are soldered as a result of heating and pressing.

As shown in more detail in FIG. 9B, the frame 17 comprises two metallic frames 18, between which there is disposed a preferably double-sided adhesive insulating film 19. On the outer sides of the two frames 18, respectively, a conductive alloy coating 21 is applied This coating may be omitted when the amount of the material on the wires 5' is sufficient for a reliable ohmic contact between the frame 17 and the wires 5'. In this case it is recommended that the frame 17 should be tinned.

This embodiment is also suitable for use with an electrode 16 in the form of a mesh, wherein the wires 5" of the second plurality (not shown) are running perpendicularly to the wires 5' of the first plurality and are in ohmic contact with the corresponding sides of the frame 17 depicted in FIG. 9.

The following embodiments illustrate how, with the help of the electrode 16 of this invention, which is produced in the form of an endless strip, an array of PV cells may be connected in series and parallel to each other thereby constituting PV modules.

Figure 10A:
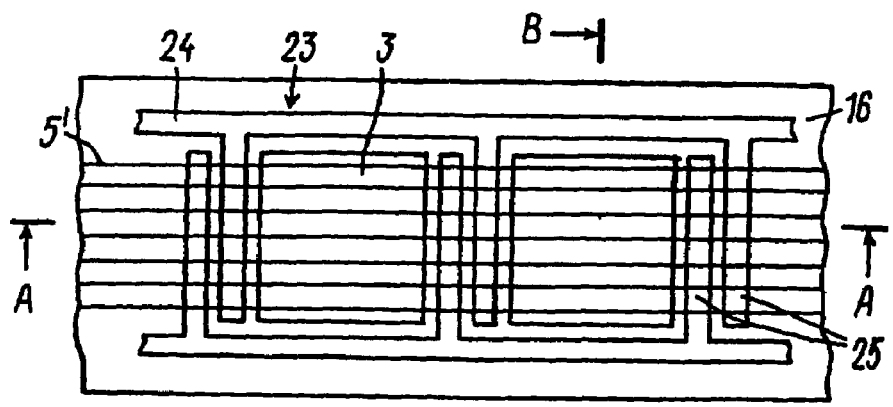
FIG. 10A is the view of several PV cells being arranged in the form of a strip, which PV cells are connected to each other in parallel.
Figure 10B:
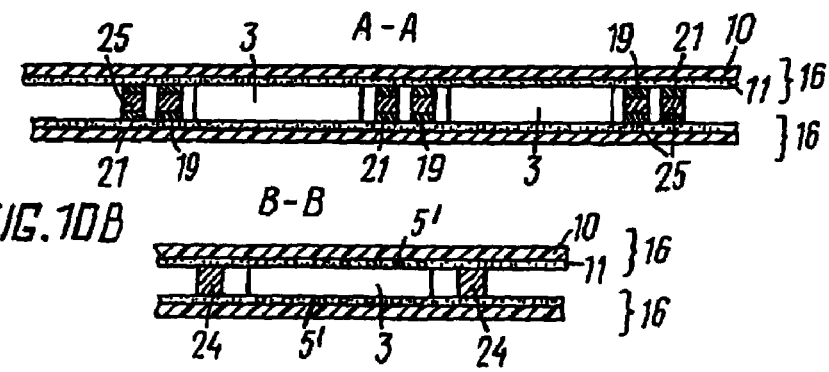
FIG. 10B shows the section A-A of FIG. 10A.
Figure 10C:
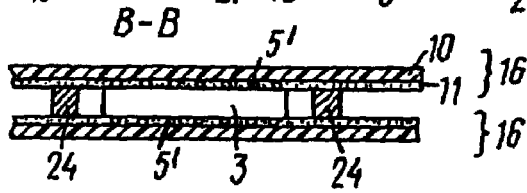
FIG. 10C shows the section B-B of FIG. 10A.

FIGS. 10A, 10B and 10C show an endless electrode 16 with comb-like terminal bars 23, the longitudinal bars 24 of which outside the wires 5' are running in parallel to them in the direction of the longitudinal extension of the endless electrode 16. The longitudinal bars 24 are integrally connected with transversely running transverse bars 25 (the "teeth" of the comb), which from the one or the other direction, respectively, are protruding into the spaces between the wafers 3.

As shown in FIG. 10B (cross section A-A of FIG. 10A), the upper surfaces of the left transverse bars 25 are provided with an insulating film 19, while on the lower surface a coating 21 is applied consisting of an electrically conductive alloy. For the right transverse bars 25 the insulating film 19 is deposited on the lower surface and the coating 21 consisting of a conductive alloy is deposited on the upper surface.

FIG. 10C shows the cross section B-B of FIG. 10A.

In the embodiment shown in FIGS. 10A to 10C the PV cells arranged that way are connected in parallel with each other, since the reeve left transverse bars 25 are electrically connected to the lower sides of the wafers 3 and the respective right transverse bars 25 are electrically connected with the upper side of the wafers 3 being located on the right side of them.

Figure 11A:
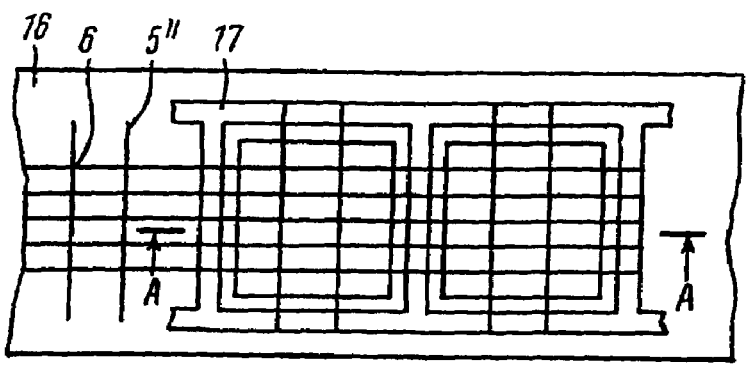
FIG. 11A is the view of several PV cells in the form of a strip and with electrodes forming a mesh, which cells are connected to each other in parallel.
Figure 11B:
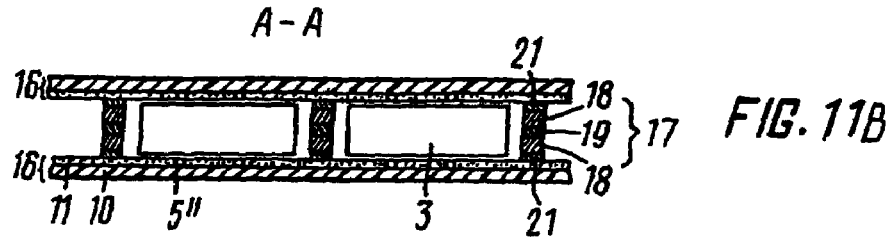
FIG. 11B shows the section A-A of FIG. 11A.

FIGS. 11A and 11B show an embodiment, wherein the PV cells parallel connections similar to FIGS. 9A and 9B are configured in the form of a three-layered frame 17, which is laminated from an endless array of metallic frames 18 arranged in series and an insulating polymeric film 19 arranged between these frames 18. On the outer sides of the frames 18 a conductive coating 21 melting at low temperatures is deposited. This coating 21 is in ohmic contact with the wires 5' and 5" of the electrode 16.

In this embodiment the wafers 3 are positioned within the "windows" of fame 17 and the PV cells are connected in parallel to each other by means of the upper and lower electrodes 16.

FIGS. 12 A and 12 B show a series connection of several PV cells. The terminal bars 25 running in transverse direction to the longitudinal extension of the electrode 16, with periodically interrupted wires 5', are provided with a coating 21 on their upper and lower sides, respectively. Hereby, the wires 5' of the upper electrode 16 provide ohmic contact between the upper side of a terminal bar 25 and the upper side of the wafer 3 arranged on the right side thereof, whereas the wires 5' of the lower electrode 16 provide ohmic contact between the lower side of each terminal bar 25 and the lower side of the wafer 3 arranged on the left side thereof.

Figure 13:
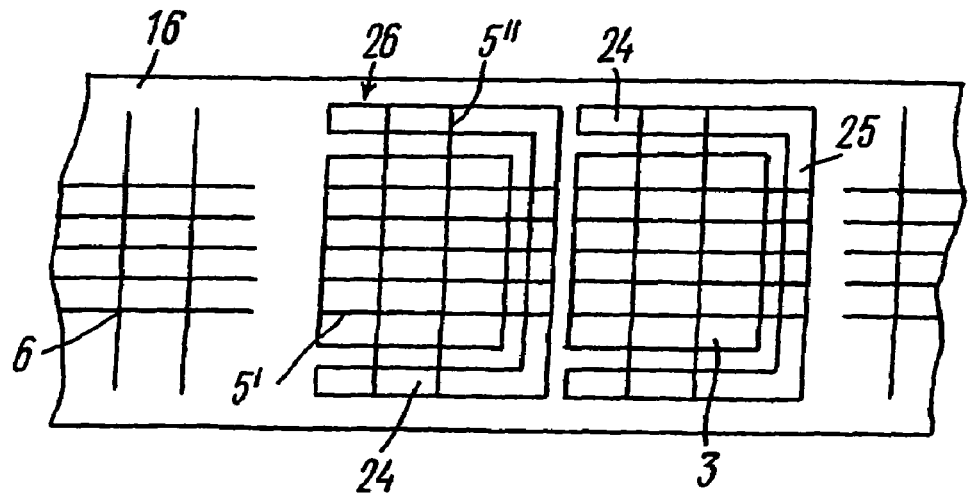
FIG. 13 is the view of a further embodiment of an electrode strip with electrode wires arranged in the form of a mesh, wherein the PV cells are also connected to each other in series.

FIG. 13 shows an endless electrode 16, wherein the PV cells' series connection is accomplished by means of U-formed metallic terminal bars 26. Bars 24 of the terminal bars running in the longitudinal direction are in ohmic contact with the wires 5", and the transverse bars 25 thereof running in a transverse direction to the electrode 16 are in ohmic contact with the wires 5'. The wafers 3 are positioned within the space of the U-formed metallic terminal bars 26 and between the upper and lower electrodes 16.

Figure 12A:
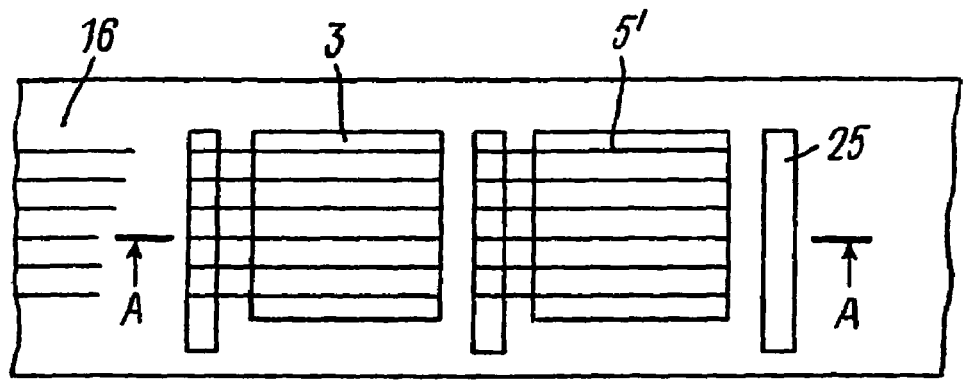
FIG. 12A shows a further embodiment of an array of PV cells being arranged in the form of a strip in which PV cells are connected in series.
Figure 12B:
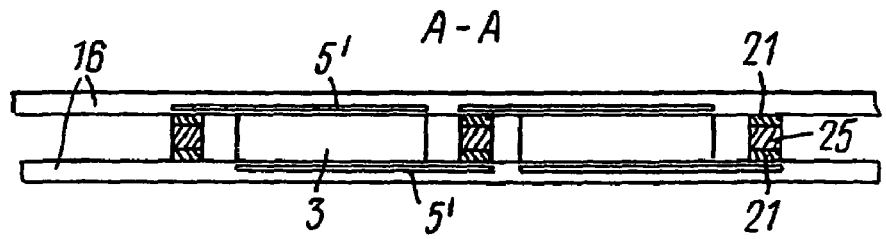
FIG. 12B shows the section A-A of FIG. 12A.

The connections of the wafers 3 with wires 5' are similar to that shown in FIG. 12B.

Figure 14A:
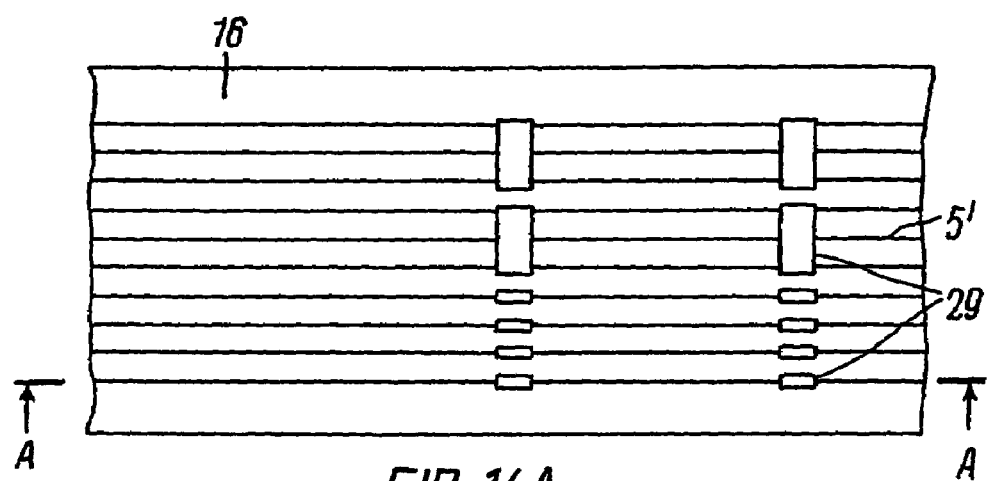
FIG. 14A is the view of an endless electrode with single electrode sections for forming one PV cell, respectively.
Figure 14B:
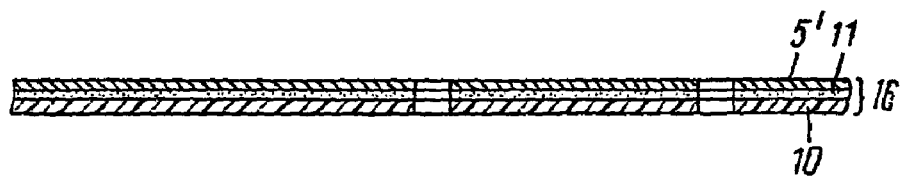
FIG. 14B shows the section A-A of FIG. 12A.

FIGS. 14A and 14B show an electrode 16 as it may be used for the PV cells' series connection as depicted on FIGS. 12A and 12B and analogously for the arrangement of FIG. 13. The wires 5' are each interrupted by perforations 29, which include either only one wire 5' or several wires 5', respectively. Of course, the solidity of the electrode 16 remains better when the perforations 29 interrupt only one wire 5', compared with the case where several neighbouring wires are perforated. In the latter case it is recommended that a strip of transparent adhesive polymeric film (not shown) be applied on the perforated part of the electrode 16 in a direction transverse to the longitudinal extension of the electrode 16.

Similarly, in the embodiment of FIG. 13 the terminal bars 24 running in the longitudinal direction may also be interrupted, along with the wires 5'. Thus, on the lower and upper side of wafer 3 respectively there may be used identical electrodes 16, which are shifted with respect to each other only by the width of the distance between the transverse bars 25 and the edge of the next wafer 3.

A basically different construction of the connections for carrying off the electrical energy is described with reference to FIGS. 15 to 19.

The basic element of the arrangement according to FIG. 15 is a laminated three-layered double frame 27 comprising two metallic frames (preferably copper foil) 28 and an insulating film 19 provided between these frames. In the central bar of double frame 27 and parallel thereto a step is provided. The height of said step corresponds to the thickness of the metal foil i.e. to about 0.2 to 0.3 mm (FIGS. 15A, 15B, 15C). As seen from FIG. 15B, the metallic frames 28 are superposed in positions shifted with respect to each other, i.e. the left upper part of a metallic frame 28 is arranged above the right lower part of the left adjacent frame 28. The insulating film 19 provided between the two superposing metallic frames 28 of adjacent double frames 27 is bent at its ends in an upward or downward direction and extends up to the surface of the frame 27 construction. The wafers 3 are positioned within the "windows" of frame 27. The wires 5' of the upper and lower perforated electrodes 16 are in ohmic contact with the surfaces of the wafer 3, and the respective left and right bars of each of the frame windows. The wires 5" are electrically connected with the wires 5' and the respective upper and lower bars of the frames. The surfaces of the metallic frames 28 in contact with the wires 5' are, if necessary, coated with an alloy coating 21 having a low melting point or are just tinned.

Thus, it is possible to serially interconnect an array of PV cells of any number.

Figure 16A:
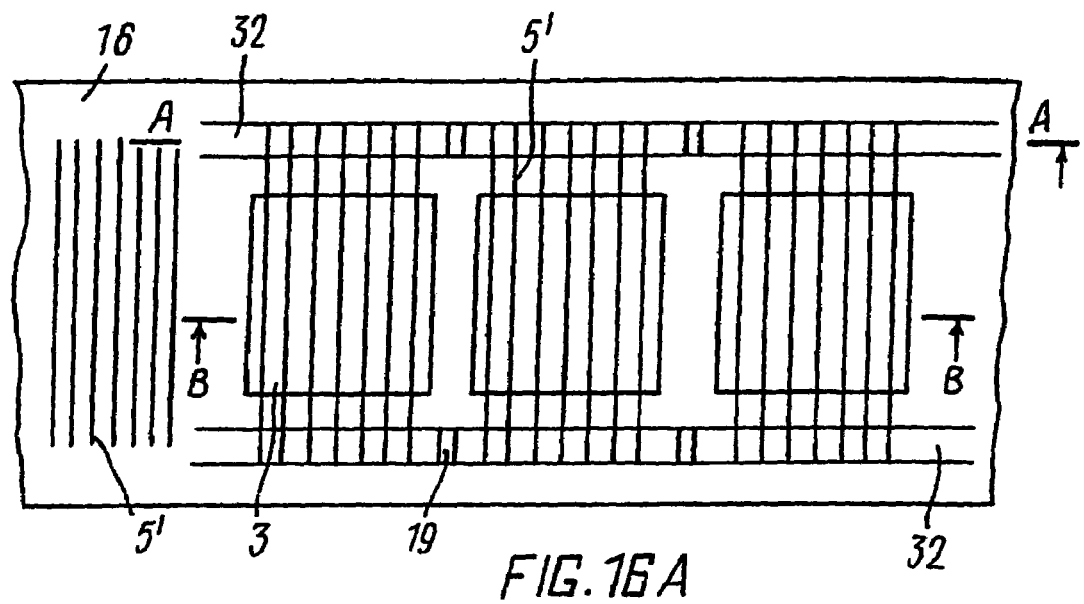
FIG. 16A shows a further embodiment of several PV cells being arranged in series in the form of a strip.
Figure 16B:
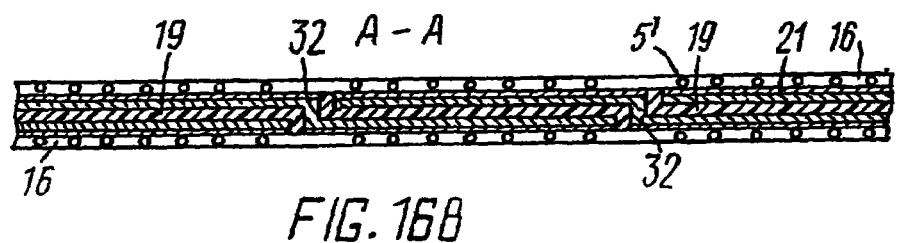
FIG. 16B shows the section A-A of FIG. 16A.
Figure 16C:
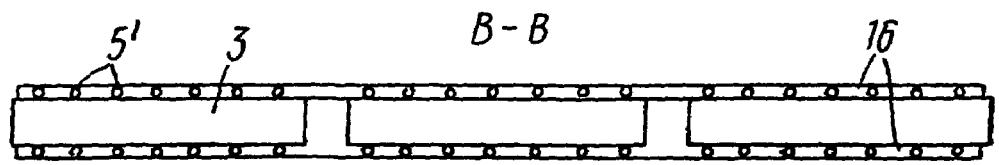
FIG. 16C shows the section B-B of FIG. 16A.

FIGS. 16A, 16B and 16C show a similar, but substantially simplified, construction wherein the non-perforated electrode 16 corresponds to that shown in FIGS. 5C and 5D. In this case longitudinal bars 32 with a step are utilized. These longitudinal bars 32 are lined up like the frames 28 as depicted on FIGS. 15B and 15C.

FIG. 17 shows in a drawn out depiction, representative of a whole array, two superposed metallic frames 28 with a step in the middle and arranged in positions shifted with respect to each other. The special feature of this arrangement is that the transverse bars 31 are spanning over the respective right lower windows, said bars 31 being integrally connected with the metalic frame 28. In this embodiment, the bars 31 take over the function of the wires 5' of the lower electrode 16 of this invention, i.e. in the completed PV cell they are in ohmic contact with the respective lower surface of the wafer 3 located above them.

In order to complete the endless array of series-connected PV cells, simple frames 30 are provided at their ends, wherein the simple frame 30 provided for at the left end of the array is also provided with bars 31.

The construction is completed by an upper electrode 16 with electrode meshes 6, the wires 5' of which are perforated and after heating and pressing are connected with the upper surface of the wafer 3 and frames 28 and 30. The lower electrode 16 has perforated wire 5" sections or wire 5" fields in longitudinal direction, said wire sections or wire fields being connected in the completed PV cell with the bars 31 and the frame 30. Here they take over the function of the wires 5", i.e. of the wires being only indirectly connected with the lower surface of wafer 3.

FIG. 18 shows an embodiment similar to that of FIG. 17 with the difference that instead of the lower electrode 16 a transparent polymeric film 10 is provided to which an adhesive 11 is applied.

Finally, in FIG. 19 an embodiment is shown similar to that depicted in FIGS. 17 and 18. The upper electrode 16 has an uninterrupted mesh 6. In order that the wires 5' of the electrode 6 can be perforated after the completion of series connection of the PV cells in the left bar and in the central bar of the frame 28 as well as in the left and right bars of the upper and lower fame 30 a slot 33 is provided. This slot 33 runs parallel to the step. These slots 33 allow for the wires 5' of the upper electrode 16 to be cut throughout after assembly of the PV module. The width of the slot 33 is calculated in such a way that the wires 5' after perforation remain permanently interrupted and isolated from each other.

The invention claimed is:

1. An electrode for contacting an electrically conductive surface of a photovoltaic element, the electrode comprising:
    an electrically insulating optically transparent film;
    an adhesive layer provided on a planar surface of said film; and
    a plurality of substantially parallel, electrically conductive wires embedded into said adhesive layer, wherein said plurality of wires lies over said planar surface of said film and wherein said adhesive layer has a thickness less than a thickness of said wires embedded therein, wherein a part of the surfaces of said wires protrudes from the adhesive layer and wherein at least said part of the surfaces protruding from said adhesive layer are covered by a coating consisting of an alloy having a low melting point, to facilitate soldering said wires to said electrically conductive surface and to a first terminal bar.

2. The electrode according to claim 1, further comprising an outer plurality of substantially parallel wires extending generally perpendicularly to said plurality of wires embedded into said adhesive layer to form a wire mesh and wherein said outer wires are operably configured for soldering to a second terminal bar.

3. The electrode according to claim 2, wherein said first and second terminal bars are electrically connected to each other.

4. The electrode according to claim 2, wherein said terminal bars are provided at respective ends of said wires embedded into said adhesive layer and said outer wires.

5. The electrode according to claim 4, wherein said terminal bars are disposed outside a contour of the photovoltaic element.

6. The electrode according to claim 5, wherein said terminal bars extend a length of two adjacent photovoltaic elements to be connected and a step is provided in a center of said terminal bars, so that a plurality of terminal bars can be fit together forming one row, in which one half of a terminal bar is arranged below or above a lower or upper half, respectively, of a neighbouring terminal bar, and wherein an insulating film is provided between neighbouring terminal bars.

7. The electrode of claim 1 wherein said wires embedded into said adhesive layer extend generally parallel to a longitudinal axis of said film.

8. The electrode of claim 1 wherein said wires embedded into said adhesive layer extend generally perpendicularly to a longitudinal axis of said film.

9. The electrode of claim 2 wherein said outer wires extend generally parallel to a longitudinal axis of said film.

10. The electrode of claim 2 wherein said outer wires are soldered to said wires embedded into said adhesive layer.

11. The electrode of claim 2 wherein said outer wires have portions embedded into said adhesive layer.

12. The electrode of claim 1 wherein said adhesive layer has a thickness less than a thickness of said wires embedded therein.

13. The electrode of claim 1 further comprising the first terminal bar electrically soldered to said wires embedded into said adhesive layer and extending transversely to said wires.

14. The electrode of claim 1 wherein said film is sufficiently thick to be drawn and to support said adhesive layer and wherein said film is sufficiently thin to have elasticity.

15. The electrode of claim 1 wherein said film has a thickness of between about 10 micrometers to about 50 micrometers.

16. The electrode of claim 1 wherein said coating is on the entire surfaces of said wires operable to be soldered onto the electrically conductive surface of the photovoltaic element.

17. An electrode for contacting an electrically conductive surface of a photovoltaic element, the electrode comprising:
   an electrically insulating optically transparent film;
   an adhesive layer provided on a planar surface of said film; and
   a plurality of substantially parallel, electrically conductive wires having lengthwise surfaces, said plurality of wires being embedded into said adhesive layer, wherein said plurality of wires lies over said planar surface of said film and wherein said adhesive layer has a thickness less than a thickness of said wires embedded therein, wherein a part of the lengthwise surfaces of said wires protrudes from the adhesive layer and wherein at least said part of the surfaces protruding from said adhesive layer are covered by a coating consisting of an alloy having a low melting point, to facilitate soldering said wires to said electrically conductive surface.

* * * * *